(12) United States Patent
Lin et al.

(10) Patent No.: US 11,469,360 B2
(45) Date of Patent: Oct. 11, 2022

(54) ELECTRONIC DEVICE

(71) Applicant: InnoLux Corporation, Miao-Li County (TW)

(72) Inventors: Chia-Hsien Lin, Miao-Li County (TW); Yung-Kan Chen, Miao-Li County (TW); Chien-Tzu Chu, Miao-Li County (TW); Min-Han Tsai, Miao-Li County (TW); Hao-Jung Huang, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 78 days.

(21) Appl. No.: 16/862,914

(22) Filed: Apr. 30, 2020

(65) Prior Publication Data

US 2020/0365789 A1 Nov. 19, 2020

Related U.S. Application Data

(60) Provisional application No. 62/846,800, filed on May 13, 2019.

(30) Foreign Application Priority Data

Jan. 10, 2020 (CN) .......................... 202010025354.7

(51) Int. Cl.
*H01L 33/64* (2010.01)
(52) U.S. Cl.
CPC ................................. *H01L 33/644* (2013.01)

(58) Field of Classification Search
CPC ......... H01L 33/64–644; H01L 23/3672; H01L 23/36; H01L 23/142; H01L 2933/0075
See application file for complete search history.

(56) References Cited

U.S. PATENT DOCUMENTS

| 9,961,809 | B1* | 5/2018 | Yoon | H01L 23/373 |
| 2006/0197181 | A1* | 9/2006 | Noguchi | H01L 25/0657 |
| | | | | 257/E23.105 |
| 2011/0019415 | A1* | 1/2011 | Chen | F21K 9/00 |
| | | | | 362/249.02 |
| 2017/0289324 | A1 | 10/2017 | Yeo et al. | |
| 2018/0040268 | A1* | 2/2018 | Murai | G09G 3/36 |
| 2018/0124957 | A1* | 5/2018 | Yoon | H01L 23/373 |
| 2018/0146579 | A1* | 5/2018 | Kim | H05K 7/20954 |

FOREIGN PATENT DOCUMENTS

JP     2012054162 A   *  3/2012

* cited by examiner

*Primary Examiner* — Latanya N Crawford Eason
(74) *Attorney, Agent, or Firm* — McClure, Qualey & Rodack, LLP

(57) ABSTRACT

An electronic device is provided. The electronic device includes: a support structure, a heat-dissipation layer, a first adhesive and an electronic panel. The heat-dissipation layer is disposed on the support structure and includes at least one first hole. The first adhesive is disposed in the at least one first hole. The electronic panel is disposed on the heat-dissipation layer.

18 Claims, 9 Drawing Sheets

ELECTRONIC DEVICE

CROSS REFERENCE TO RELATED APPLICATIONS

This application claims the benefit of U.S. Provisional Application No. 62/846,800 filed on May 13, 2019, and claims priority of China Patent Application No. 202010025354.7, filed Jan. 10, 2020, the entirety of which are incorporated by reference herein.

BACKGROUND

Field of the Disclosure

The present disclosure relates to an electronic device, and in particular to an electronic device having a heat-dissipation layer.

Description of the Related Art

Electronic devices may generate thermal energy while operating, but the thermal energy or heat-dissipation conditions of the electronic devices in different regions may be different, so that the colors of the light-emitting diodes (LEDs) located in different regions may also be different, which affects the color (e.g. with different chromaticity) or brightness of the light, making the brightness of the electronic devices uneven. Therefore, how to solve the aforementioned problem has become an important topic.

BRIEF SUMMARY

Some embodiments of the disclosure provide an electronic device, including: a support structure, a heat-dissipation layer, a first adhesive and an electronic panel. The heat-dissipation layer is disposed on the support structure and includes at least one first hole. The first adhesive is disposed in the at least one first hole. The electronic panel is disposed on the heat-dissipation layer.

For making the above or other purposes, features and advantages of the present disclosure more clear, some embodiments are provided in the following paragraphs, and subsequent detailed description is provided as follows with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION

Figure 1:
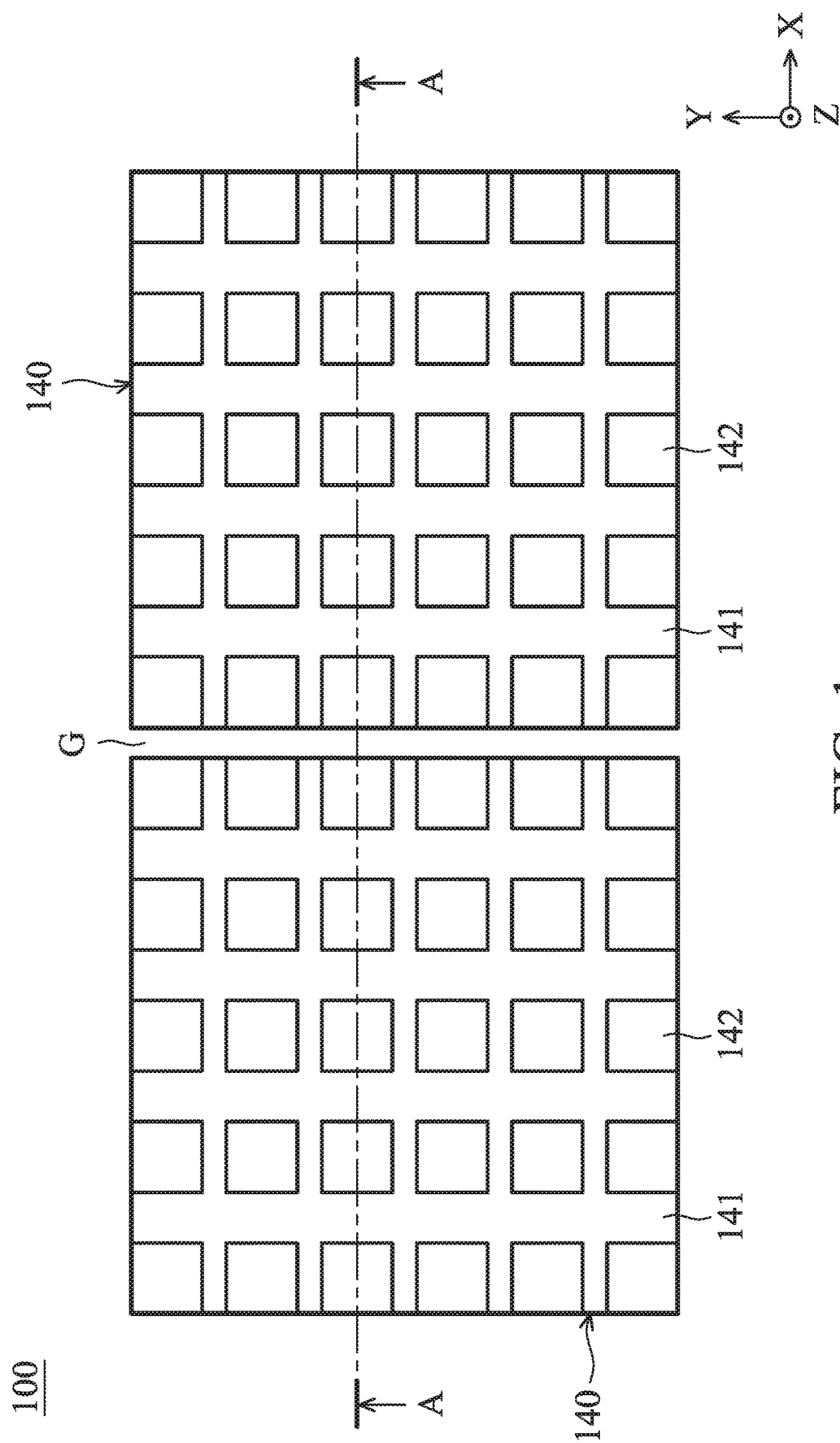
FIG. 1 is a top view illustrating an electronic device in accordance with some embodiments of the present disclosure.

The electronic devices of some embodiments of the present disclosure are described in the following description. The specific embodiments disclosed are provided merely to clearly describe the usage of the present disclosure by some specific methods without limiting the scope of the present disclosure.

The present disclosure can be understood by referring to the following detailed description and the accompanying drawings. It should be noted that, in order to make the reader easy to understand and the simplicity of the drawings, the multiple drawings in the present disclosure may merely illustrate a portion of the electronic device, and certain elements in the drawings are not drawn to actual scale. In addition, the number and size of each element in the figures are merely for illustration, and are not intended to limit the scope of the present disclosure.

Certain terms may be used throughout the present disclosure and the appended claims to refer to particular elements. Those skilled in the art would understand that electronic device manufacturers may refer to the same components under different names. The present specification is not intended to distinguish between components that have the same function but different names. In the following specification and claims, the words "including", "containing", "having" and the like are open words, so they should be interpreted as meaning "including but not limited to . . . " Therefore, when the terms "including", "containing" and/or "having" are used in the description of the present disclosure, they specify the existence of corresponding features, regions, steps, operations, and/or components, but do not exclude one or more existence of a corresponding feature, region, step, operation, and/or component.

In addition, in this specification, relative expressions may be used. For example, "lower", "bottom", "higher" or "top" are used to describe the position of one element relative to another. It should be noted that if a device is flipped upside down, an element that is "lower" will become an element that is "higher."

When a corresponding component (such as a film layer or region) is referred to as "on another component", it may be directly on another component, or there may be other components in between. On the other hand, when a component is called "directly on another component", there is no component between the former two. In addition, when a component is called "on another component", the two components have an up-down relationship in the top view, and this component can be above or below the other component, and this up-down relationship depends on the orientation of the device.

The terms "about", "equal to", "equal" or "identical", "substantially" or "approximately" are generally interpreted as within 20% of a given value or range, or as interpreted as within 10%, 5%, 3%, 2%, 1%, or 0.5% of a given value or range.

It should be understood that, although the terms "first", "second," "third" etc. may be used herein to describe various elements, regions, layers and/or portions, and these elements, regions, layers, and/or portions should not be limited by these terms. These terms are only used to distinguish one element, component, region, layer, or portion. Thus, a first element, component, region, layer or portion discussed below could be termed a second element, component, region, layer or portion without departing from the teachings of some embodiments of the present disclosure. In addition, for the sake of clarity, the terms "first", "second," "third" etc. may not be used in the specification to distinguish different elements. The first element, the second element and/or the third element recited in the claims may be referred to any element that conforms to the description in the specification.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure. In addition, the term "substrate" in the following paragraphs may include elements formed on the substrate or various layers covering the substrate, such as any active component (e.g. transistor) that is formed thereon as required. However, in order to simplify the figures herein, it is shown as a plane substrate.

FIG. 1 is a cross-sectional view illustrating an electronic device 100 in accordance with some embodiments of the present disclosure. It should be noted that, the electronic device 100 may include a display device, an antenna device, a sensing device or a tiled device, but is not limited thereto. The electronic device may be a bendable or flexible electronic device. The electronic device may include a liquid-crystal light-emitting diode, and the light-emitting diode may include organic light-emitting diode (OLED), mini LED, micro LED or quantum dot (QD) light-emitting diode (which may be referred to as QLED, QDLED), fluorescence, phosphor or other suitable materials, and the materials can be arranged and combined arbitrarily, but the present disclosure is not limited thereto.

Referring to FIG. 1, the electronic device 100 includes an electronic panel 140. The electronic panel 140 includes a substrate 141 and at least one light-emitting element 142 disposed on the substrate 141. The light-emitting elements 142 are arranged in an array or in a staggered manner (for example, PenTile), but are not limited thereto. In some embodiments, the electronic device 100 includes a plurality of electronic panels disposed on a support structure SS. For example, the electronic device 100 includes two (or more than two) electronic panels 140 disposed on the support structure SS, and a gap is formed between two of the plurality of electronic panels 100.

Figure 2:
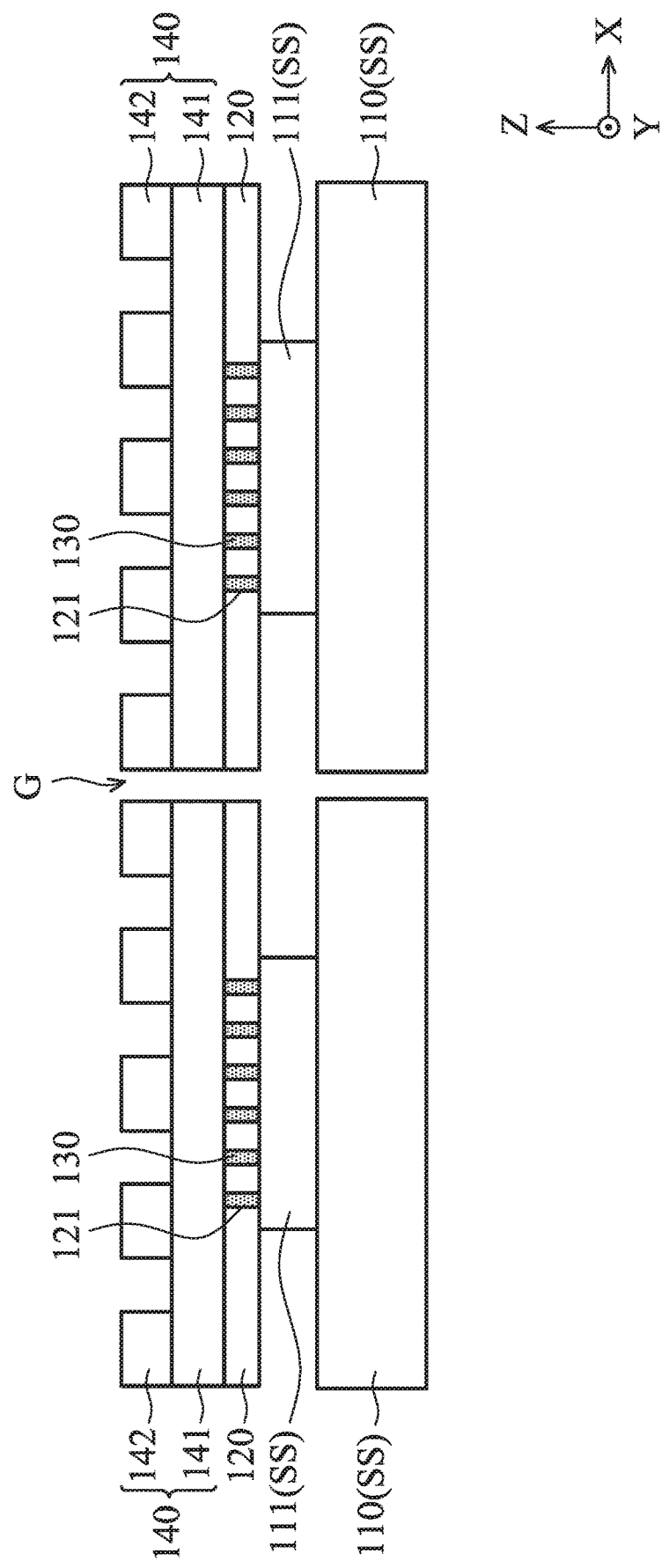
FIG. 2 is a top view illustrating along the line A-A shown in FIG. 1.

Please refer to FIG. 2. FIG. 2 is a top view illustrating along the line A-A shown in FIG. 1. As shown in FIG. 2, the electronic device 100 includes a support structure SS (for example, including a support plate 110 and/or a spacer 111), a heat-dissipation layer 120, a first adhesive 130, and an electronic panel 140, but is not limited thereto. In some embodiments, the spacer 111 is disposed on the support plate 110. As shown in FIG. 2, the electronic device 100 includes two electronic panels 140, two support structures SS, and two heat-dissipation layers 120. In this embodiment, the electronic panels 140 are disposed on the support structures SS, and the heat-dissipation layers 120 are disposed between the electronic panels 140 and the support structures SS (such as the spacer 111), but they are not limited thereto. In other words, the heat-dissipation layers 120 are disposed on the support structures SS (such as the spacer 111), and the electronic panels 140 are disposed on the heat-dissipation layers 120. For example, the support plate 110 includes a metal material (for example, stainless steel, aluminum), bakelite, a polymer material (for example, polyimide, phenolic resin), other suitable materials or a combination thereof, but it is not limited thereto. In some embodiments, the support board 110 includes a printed circuit board (PCB). In some embodiments, the spacer 111 may include, but is not limited to, glass, metal (e.g. stainless steel, aluminum), other suitable materials or a combination thereof. For example, the material of the support plate 110 includes aluminum, and the material of the spacer 111 includes glass, but they are not limited thereto. In some embodiments, the support plate 110 and the spacer 111 may use the same material. In some embodiments, the support plate 110 and the spacer 111 may use different materials. In some embodiments, the support plate 110 and the spacer 111 may be integrally made, but it is not limited thereto. In some embodiments, a bonding layer (not shown) may be selectively provided between the heat-dissipation layer 120 and the electronic panel 140. The bonding layer may be used to bond the heat-dissipation layer 120 and the electronic panel 140 to reduce the chance of an offset between the heat-dissipation layer 120 and the electronic panel 140. In some embodiments, the material of the bonding layer may be sticky. In some embodiments, the heat-dissipation layer 120 may include graphite, a metallic material (such as aluminum, copper or other metals), other suitable materials or a combination thereof, but is not limited thereto. In some embodiments, the heat-dissipation layer 120 may include a single-layer structure or a multi-layer structure. By disposing the heat-dissipation layer 120, the thermal energy generated by the electronic panel 140 can be dispersed, so that the temperatures of the electronic panel in different regions may be approximately similar, or the unevenness of brightness of the electronic panel 140 may be reduced, but it is not limited thereto.

Please refer to FIG. 2. In some embodiments, the heat-dissipation layer 120 includes at least one first hole 121. The first hole 121 is a hole penetrating the heat-dissipation layer 120. In some embodiments, the support structure SS includes an adhesive region, and the adhesive region may be defined as a region of the support structure SS that includes the spacer 111. In other words, the adhesive region is a region where the spacer 111 is projected onto the support plate 110. In some embodiments, the position of the at least one first hole 121 corresponds to the adhesive region. That is, the position of the at least one first hole 121 may correspond to the spacer 111. In addition, the support structure SS may further include a non-adhesive region, and the non-adhesive region may be defined as a region of the support structure SS without the spacer 111. In other words, the non-adhesive region is, for example, the remaining region of the support structure SS that the adhesive region is excluded. In some embodiments, the first adhesive 130 is disposed in the at least one first hole 121. For example, the first adhesive 130 may include a mixed hardening glue, a heat-curing glue, a light-curing glue, a moisture-curing glue, any other adhesive material or a combination thereof, such as an epoxy resin, but it is not limited thereto. In some embodiments, the first adhesive 130 is used to attach the support structure SS (such as the spacer 111) and/or the electronic panel 140 to reduce the probability that the heat-dissipation layer 120 shifts. In some embodiments (not shown), the first adhesive 130 is in contact with a bonding layer (not shown) as described above, and the bonding layer is disposed between the heat-dissipation layer 120 and the electronic panel 140. In this embodiment, the first adhesive 130 may be substantially flush with the upper surface (i.e. the surface adjacent to the electronic panel 140) and/or the lower surface (i.e. the surface adjacent to the spacer 111) of the heat-dissipation layer 120, and may be used for attaching to the support structure SS and the electronic panel 140, but it is not limited thereto. The first adhesive 130 may be substantially flush with the upper surface and/or the lower surface of the heat-dissipation layer 120, which means that the first adhesive 130 may be partially located on the upper surface of the heat-dissipation layer 120 and/or the lower surface of the heat-dissipation layer 120. However, the first adhesive 130 on the upper and/or the lower surface of the heat-dissipation layer 120 is discontinuous.

Other embodiments are provided below. It should be understood that, the electronic device shown in the following embodiments may include the same or similar parts as the electronic device 100 shown in FIGS. 1 and 2. These parts will be represented by similar symbols to facilitate identification, so they will not be described again.

It should be noted that, the positions of the first holes shown in this embodiment merely serve as examples, and those skilled in the art can arbitrarily adjust the arrangement of the first holes as long as the position of the first holes corresponds to the adhesive region. In other words, the position of the first holes is located above the spacer.

Figure 3:
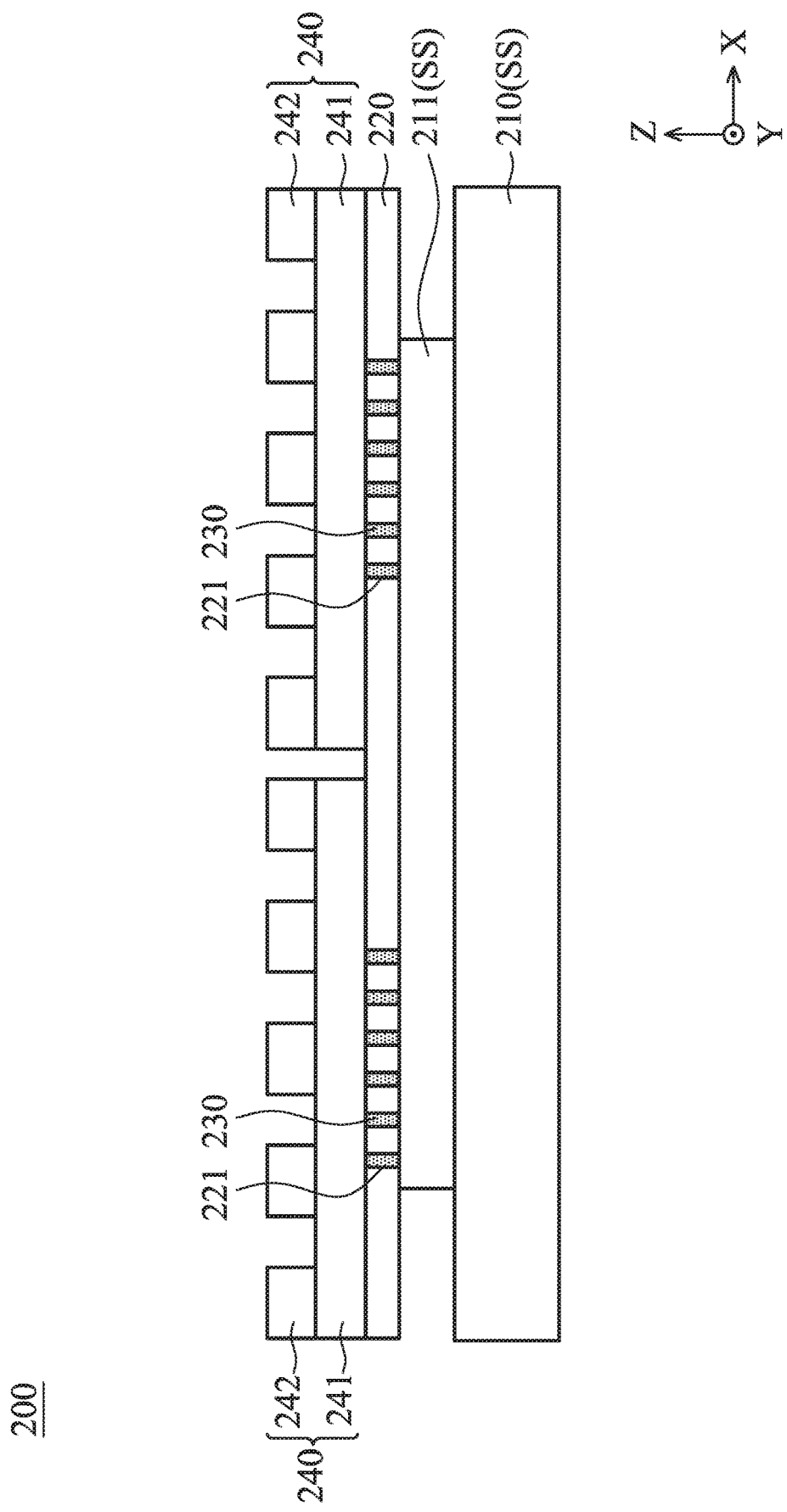
FIG. 3 is a cross-sectional view illustrating the electronic device in accordance with some other embodiments of the present disclosure.

Please refer to FIG. 3. FIG. 3 is a cross-sectional view illustrating the electronic device 200 in accordance with some other embodiments of the present disclosure. The electronic device 200 includes a support structure SS (including a support plate 210 and/or a spacer 211), a heat-dissipation layer 220, a first adhesive 230, and an electronic panel 240. The electronic panel 240 includes a substrate 241 and at least one light-emitting element 242 disposed on the substrate 241. The electronic device 200 is similar to the electronic device 100, and one of the differences between the electronic device 200 and the electronic device 100 is that the two of the plurality of electronic panels 240 in the electronic device 200 share the support structure SS (including one support plate 210 and/or one spacer 211). That is, a single support structure SS is used to support two electronic panels 240, but the present disclosure is not limited thereto. In this embodiment, the two of the plurality of electronic panels 240 share the heat-dissipation layer 220, but it is not limited thereto. In this embodiment, the heat-dissipation layer 220 includes at least one first hole 221, and the first adhesive 230 is disposed in the first hole 221, for example.

Figure 4:
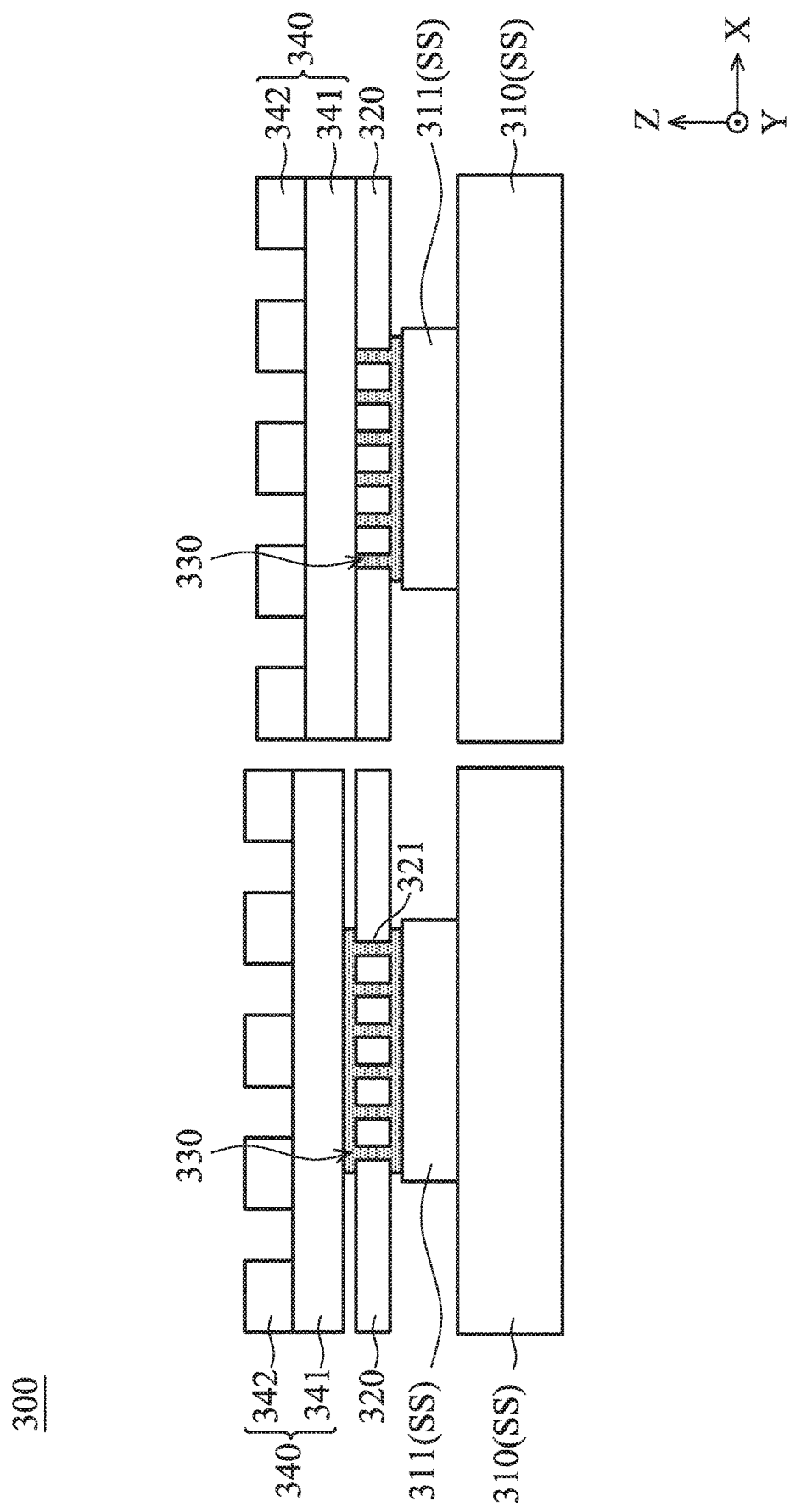
FIG. 4 is a cross-sectional view illustrating the electronic device in accordance with some other embodiments of the present disclosure.

Please refer to FIG. 4. FIG. 4 is a cross-sectional view illustrating the electronic device 300 in accordance with some other embodiments of the present disclosure. The electronic device 300 includes a support structure SS (including a support plate 310 and/or a spacer 311), a heat-dissipation layer 320, a first adhesive 330, and an electronic panel 340. The electronic panel 340 includes a substrate 341 and at least one light-emitting element 342 disposed on the substrate 341. The electronic device 300 is similar to the electronic device 100, and one of the differences between the electronic device 300 and the electronic device 100 is that the first adhesive 330 contacts the lower surface (the surface adjacent to the heat-dissipation layer 320) of the substrate 341 and/or the upper surface (i.e. the surface adjacent to the heat-dissipation layer 320) of the support structure SS (such as the spacer 311). In some embodiments, referring to the left half of FIG. 4, the first adhesive 330 is located between the substrate 341 of the electronic panel 340 and the heat-dissipation layer 320 and contacts the lower surface of the substrate 341 and the upper surface 320 (e.g. the surface adjacent to the substrate 341) of the heat-dissipation layer 320. The first adhesive 330 is located between the spacer 311 of the support structure SS and the heat-dissipation layer 320, and the first adhesive 330 contacts the upper surface of the spacer 311 and the lower surface of the heat-dissipation layer (e.g. the surface that is farther away from the substrate 341). In some embodiments, referring to the right half of FIG. 4, the first adhesive 330 may be substantially flush with the upper surface of the heat-dissipation layer 320, and the first adhesive 330 is located between the spacer 311 and the heat-dissipation layer 320. The first adhesive 330 contacts the upper surface of the spacer 311 and the lower surface of the heat-dissipation layer 320. Similarly, in other embodiments (not shown), the first adhesive 330 may be substantially flush with the lower surface of the heat-dissipation layer 320, and the first adhesive 330 is located between the heat-dissipation layer 320 and the substrate 341 of the electronic panel 340. The first adhesive 330 may contact the lower surface of the substrate 341 and the upper surface of the heat-dissipation layer 320. Although the different arrangements of the first adhesive 330 are shown in this embodiment, they merely serve as examples. The arrangement described in this embodiment is not necessary to be actually implemented. Those skilled in the art may make changes and combinations to all the above embodiments, and these changes and combinations will not be described in detail below.

Figure 5:
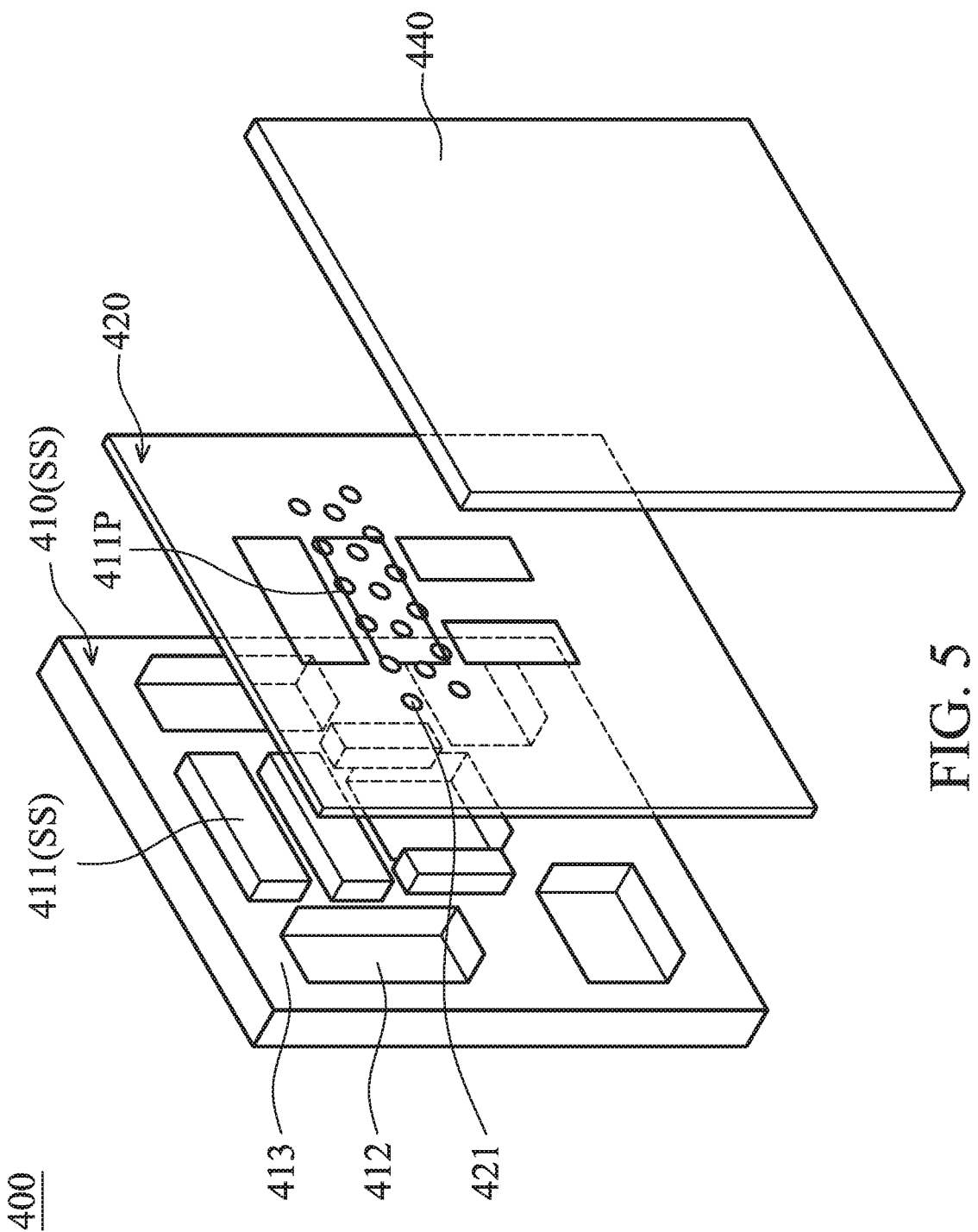
FIG. 5 is a perspective view illustrating the electronic device in accordance with some other embodiments of the present disclosure.

FIG. 5 is a perspective view illustrating the electronic device 400 in accordance with some other embodiments of the present disclosure. The electronic device 400 includes a support structure SS (including a support plate 410 and a spacer 411), a heat-dissipation layer 420, and an electronic panel 440. In some embodiments, the support plate 410 has a surface 413 that faces the heat-dissipation layer 420, and the support plate 410 may have at least one groove 412. In some embodiments, the groove 412 may selectively penetrate or non-penetrate the support plate 410. In some embodiments, the groove 412 does not penetrate the support plate 410, and the notch of the groove 412 faces the heat-dissipation layer 420. In some embodiments, the spacer 411 is disposed on the surface 413 of the support plate 410. In some embodiments, a portion of the spacer 411 is correspondingly disposed in the groove 412 of the support plate 410, and a portion of the spacer 411 protrudes out of the groove 412. It should be noted that, the arrangement of the spacer 411 and/or the position and/or appearance (including shape, size, etc.) of the groove 412 can be adjusted as required. The spacer 411 and/or the groove 412 shown in FIG. 5 is rectangle for example, but they are not limited thereto. The arrangement of the spacers 411 and/or the grooves 412 as above can be used to assemble other components in the electronic device 400 (such as a circuit board, a chip, or other components). Therefore, the configuration of the spacer 411 and/or the groove 412 may be adjusted by those skilled in the art as required, and will not be described in detail below. In some embodiments, the heat-dissipation layer 420 may have at least one first hole 421, and the first hole 421 is disposed substantially corresponding to the adhesive region of the support structure SS (as defined above, that is, the region substantially corresponding to the spacer 411). As shown in FIG. 5, the position of the first hole 421 corresponds to the projection area 411P (that is, the projection area where the spacer 411 is projected onto the heat-dissipation layer). In some embodiments, a portion of the first holes 421 may also be disposed corresponding to the non-adhesive region (defined as above, that is, the remaining area other than the adhesive region) of the support structure SS. Namely, the position of the portion of the first holes 421 corresponds to the outside of the projection area 411P. The configuration of the heat-dissipation layer and its first hole will be described in detail in different embodiments as follows. In some embodiments (not shown), when the electronic device 400 is arranged or hung in an upright manner, the heat-dissipation layer 420 can be roughly divided into three parts, such as the first part (upper end region), the second part (central region) and the third part (lower end region), the positions of the first holes 421 in the heat-dissipation layer 420 may be located at the first part (upper end region) and the second part (central region), to improve the mechanical strength of the electronic device, but they are not limited thereto. In other embodiments (not shown), the positions of the first holes 421 of the heat-dissipation layer 420 may be located in the first part (upper end region), the second part (central region) and/or the third part (lower end region).

Figure 6:
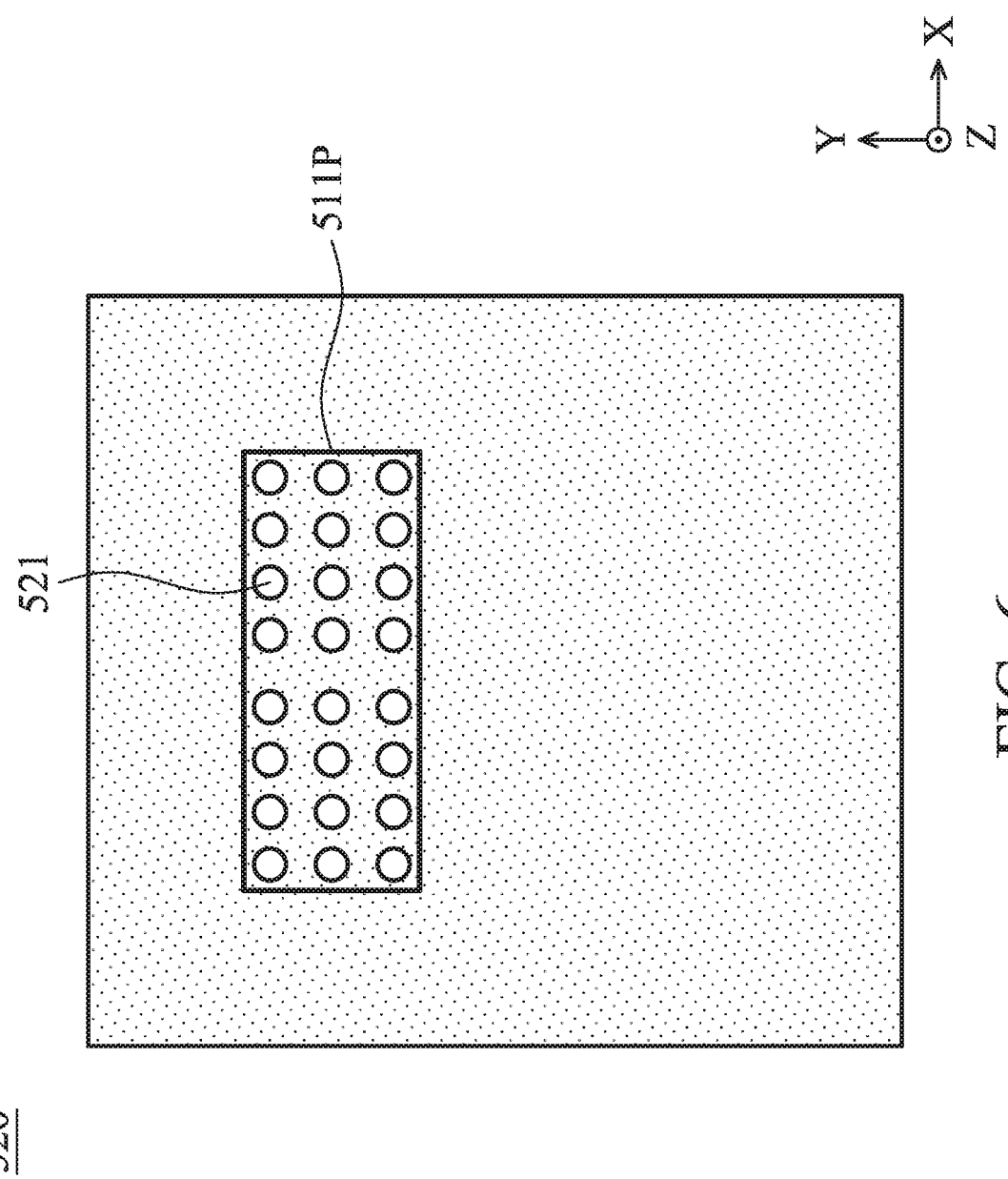
FIG. 6 is a top view illustrating a heat-dissipation layer in accordance with some embodiments of the present disclosure.

FIG. 6 is a top view illustrating a heat-dissipation layer 520 in accordance with some embodiments of the present disclosure. In some embodiments, the heat-dissipation layer 520 may have at least one first hole 521, and the position of the first hole 521 corresponds to the adhesive region. In some embodiments, the thermal conductivity of the heat-dissipation layer 520 may be in a range from 400 W/mK to 1500 W/mK (400 W/mK≤thermal conductivity≤1500 W/mK), and the diameter (or width) of the first hole 521 may be approximately in the range from 3 millimeters (mm) to 8 mm (3 mm≤diameter (or width)≤8 mm), or the area of one of the at least one the first hole 521 in the X-Y plane (that is, the plane perpendicular to the normal direction Z of the vertical heat sink 520) may be approximately in the range from 7 mm2 to 64 mm2 (7 mm2≤area≤64 mm2), but it is not limited thereto. In this embodiment, the ratio of the total area of the at least one first holes 521 on the X-Y plane to an area of the adhesive region (that is, the area of the projection area 511P where the spacer 411 is projected onto the heat-dissipation layer 520) is in a range from 20% and 30% (20%≤area ratio 30%), but it is not limited thereto.

In some embodiments, the thermal conductivity of the heat-dissipation layer 520 may be in a range of 30 W/mK to 399 W/mK (30 W/mK≤thermal conductivity≤399 W/mK), and a diameter of one of the at least one first hole 521 (or width) may be approximately in a range from 0.5 mm to 3 mm (0.5 mm≤diameter (or width)≤3 mm), or an area of one of the at least one first hole 521 on the X-Y plane may be approximately in a range from 0.25 mm2 to 9 mm2 (0.25 mm2≤area≤9 mm2), but it is not limited thereto. In this embodiment, the ratio of the total area of the at least one first holes 521 on the X-Y plane to an area of the adhesive region is in the range of about 30% to 40% (30%≤area ratio≤40%), but it is not limited thereto. It should be noted that, the diameter (or width) of the first holes 521, area of the first holes 521 or the area ratio of the total area of the first holes 521 to the adhesive region can be adjusted according to the difference in the thermal conductivity of the heat-dissipation layer 520 for reducing the temperature differences of the electronic device in different regions. In some embodiments, the smaller the area of the first holes 521 is, the denser the first holes 521 are arranged to improve the bonding effect of the adhesive disposed in the first holes 521, but it is not limited thereto.

Figure 7:
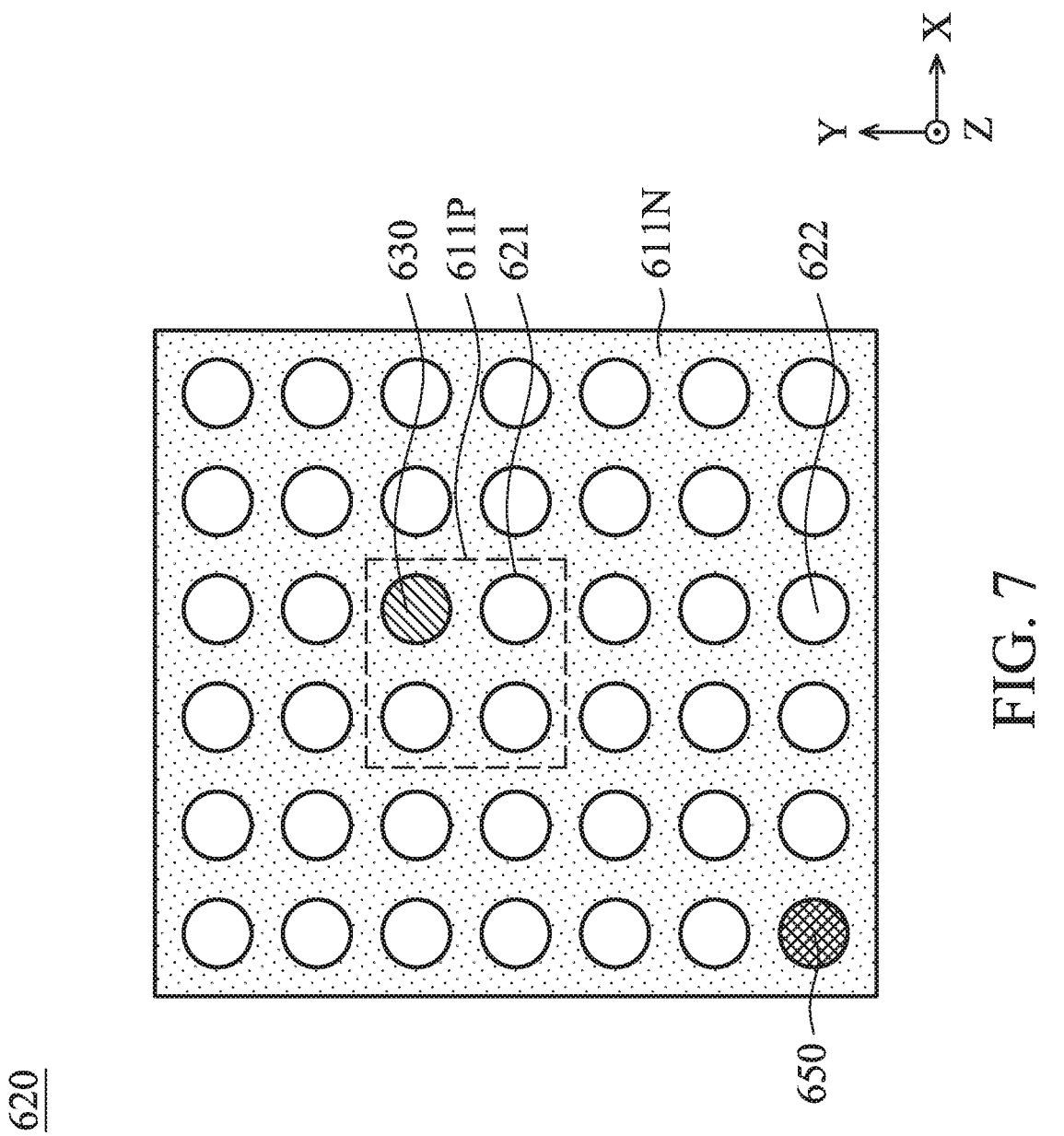
FIG. 7 is a top view illustrating the heat-dissipation layer in accordance with some other embodiments of the present disclosure.

FIG. 7 is a top view illustrating the heat-dissipation layer 620 in accordance with some other embodiments of the present disclosure. As shown in FIG. 7, the heat-dissipation layer 620 has at least one first hole 621, and the position of the first hole 621 corresponds to the adhesive region. In other words, the position of the first hole 621 corresponds to the projection area 611P (that is, an area of the spacer 411 projected onto the heat-dissipation layer 620). In addition, the heat-dissipation layer 620 may have at least one second hole 622, and a position of the at least one second hole 622 corresponds to the non-adhesive region. In other words, the second hole 622 is disposed corresponding to the non-projection area 611N. In some embodiments, the shapes and/or sizes of the first hole 621 and the second hole 622 may be the same or different, and they may be adjusted as required. In some embodiments, the second adhesive 650 may be selectively disposed in or filled in the at least one second hole 622. In some embodiments, the heat-dissipation characteristics of the first adhesive 630 may the same as the heat-dissipation characteristics of the second adhesive 650, or they may be different. For example, the heat-dissipation characteristics of the second adhesive 650 may be better than the heat-dissipation characteristics of the first adhesive 630, thereby increasing heat-dissipation, but they are not limited thereto. In some embodiments, the second adhesive 650 includes a thermal grease material, such as silicone resin, polyurethane, hot melt adhesive, polymer material, metal material, nitride, oxide, any other suitable material or a combination thereof, but it is not limited thereto. It should be noted that, the first adhesive 630 and the second adhesive 650 are made of different materials. In other word, the material of the first adhesive 630 is different from the material of the second adhesive 650. In some embodiments, the adhesive properties of the first adhesive 630 are the same as or different from the adhesive properties of the second adhesive 650. For example, the adhesive properties of the first adhesive 630 may be better than those of the second adhesive 650, thereby improving adhesion, but they are not limited thereto. The present embodiment merely serves as a schematic example. Those skilled in the art may arbitrarily arrange the second adhesive 650 in the second hole 622 as required. In addition, by forming the second hole 622 in the heat-dissipation layer 620 and providing the second adhesive 650 in the second hole 622, the difference of coefficients of thermal expansion (CTE) between the heat-dissipation layer 620 and the electronic panel (as shown in the foregoing embodiment) may be reduced, so that warpage between the heat-dissipation layer 620 and the electronic panel may be reduced.

Figure 8:
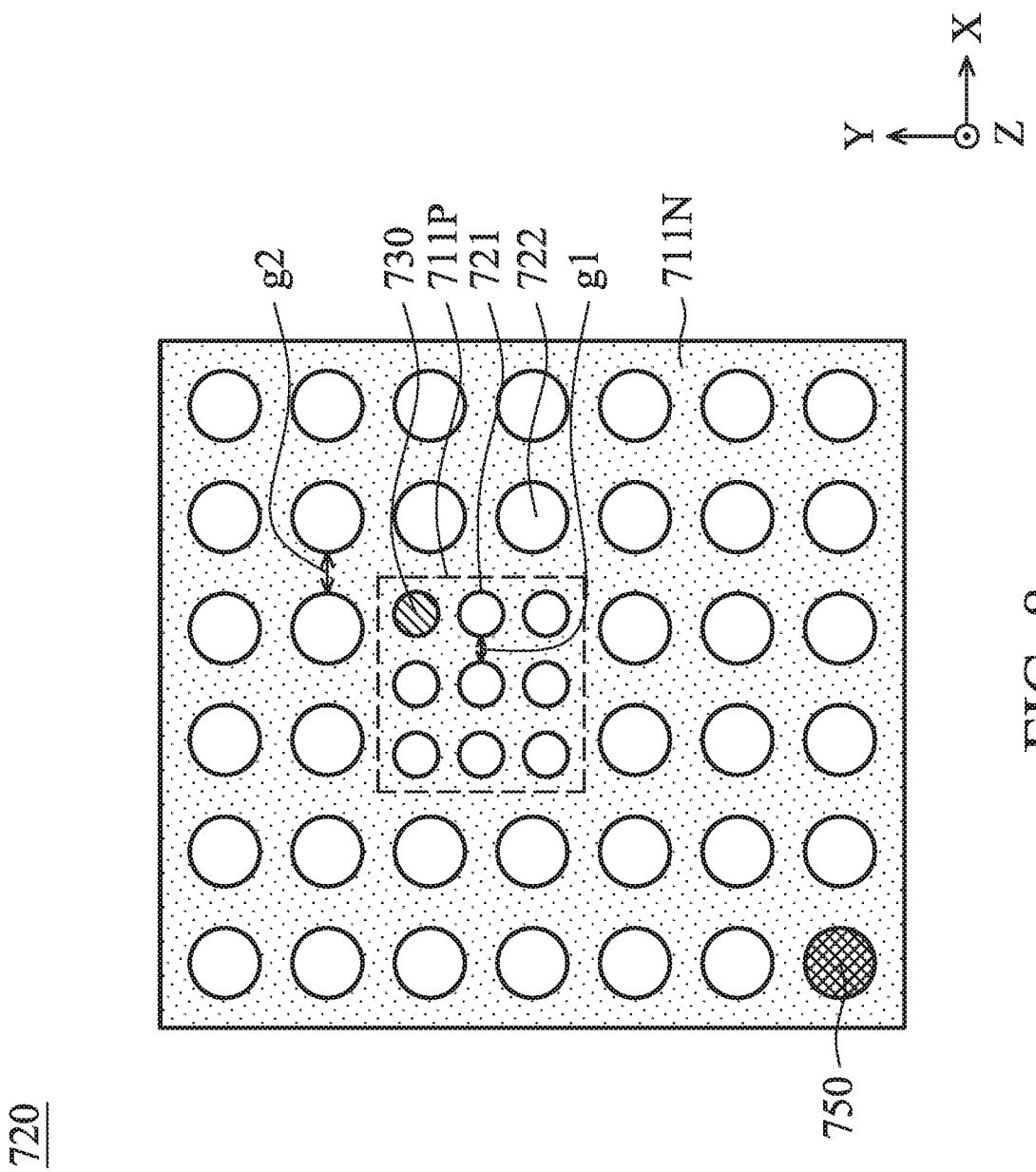
FIG. 8 is a top view illustrating the heat-dissipation layer in accordance with some other embodiments of the present disclosure.

FIG. 8 is a top view illustrating the heat-dissipation layer 720 in accordance with some other embodiments of the present disclosure. As shown in FIG. 8, the heat-dissipation layer 720 has at least one first hole 721 and at least one second hole 722. The position of the first hole 721 corresponds to the adhesive region, and the adhesive region may correspond to the projection area 711P (where the spacer 411 is projected onto the heat-dissipation layer 720). The position of the second hole 722 is disposed corresponding to the non-projection area 711N (that is, an area other than the projection area 711P). In some embodiments, a first adhesive 730 may be disposed or filled in the first hole 721, and a second adhesive 750 may be selectively disposed or filled in the second hole 722. In some embodiments, the area of one of the at least one first hole 721 may be smaller than the area of one of the at least one second hole 722 in the normal direction Z of the heat-dissipation layer 720. In some embodiments, on the X-Y plane (that is, the plane perpendicular to the normal direction Z of the heat-dissipation layer 720), a minimum distance g1 between adjacent two of the plurality of first holes 721 may be smaller than a minimum distance g2 between adjacent two of the plurality of second holes 722. The minimum distance g1 and the minimum distance g2 are measured in the same direction (for example, X direction, Y direction or other direction that is perpendicular to the normal direction Z of the heat-dissipation layer 720), and the minimum distance g1 and the minimum distance g2 shown in FIG. 8 are measured in the X direction, for example.

Figure 9:
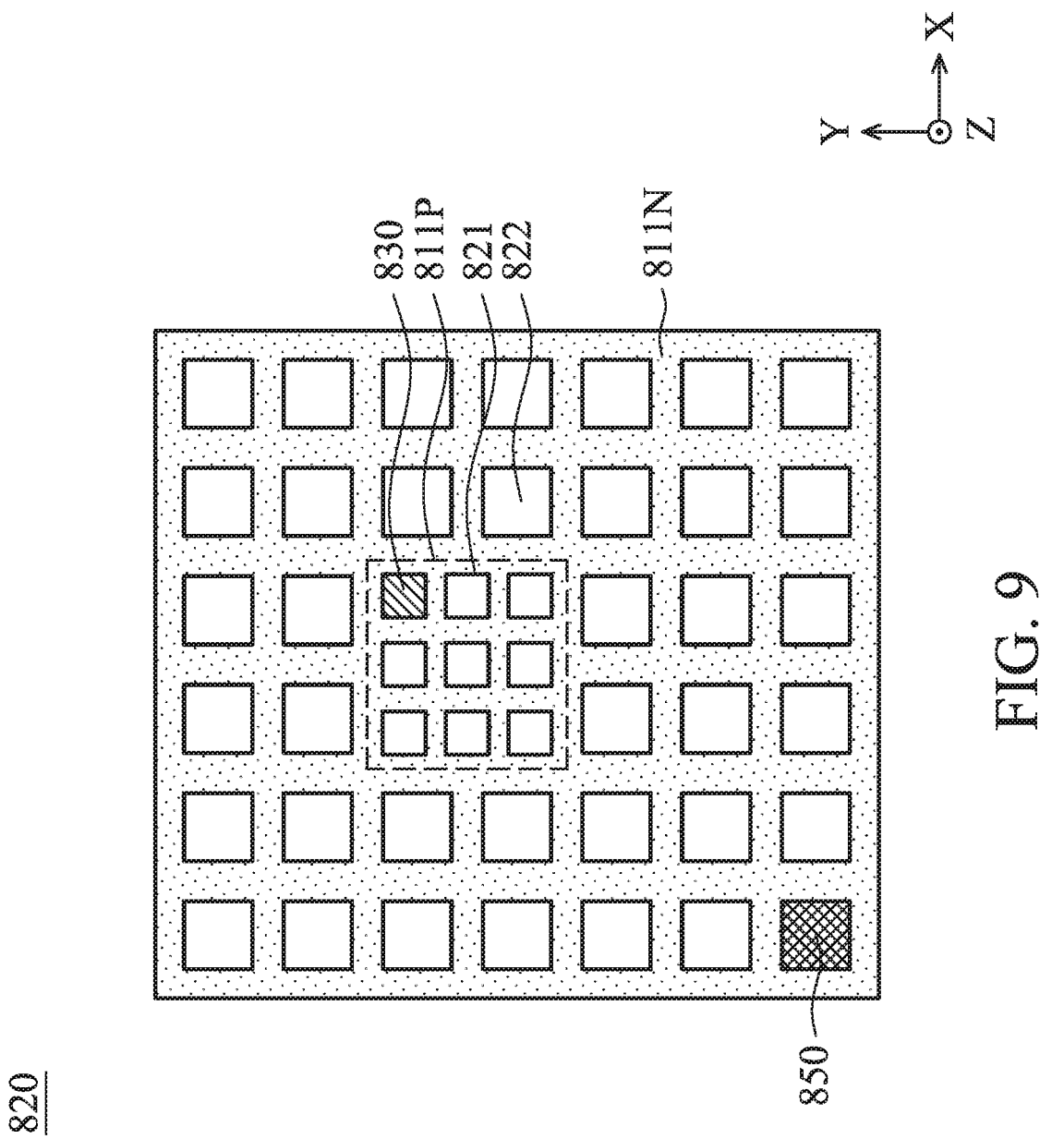
FIG. 9 is a top view illustrating the heat-dissipation layer in accordance with some other embodiments of the present disclosure.

FIG. 9 is a top view illustrating the heat-dissipation layer 820 in accordance with some other embodiments of the present disclosure. As shown in FIG. 9, a rectangular first hole 821 and/or a second hole 822 may be disposed in the heat-dissipation layer 820. In some embodiments, a first adhesive 830 may be disposed in or filled in the first hole 821, and a second adhesive 850 may be selectively disposed in or filled in the second hole 822.

All the above embodiments merely serve as examples, and those skilled in the art may arrange the first holes and/or the second holes as any shape (such as an oval shape, a polygonal shape, or an irregular shape) as required. In some embodiments, different first holes (and/or second holes) may be different sizes. In addition, the first hole (and/or the second hole) may be formed by, for example, cutting, drilling (such as laser drilling or mechanical drilling), or another suitable method.

As set forth above, some embodiments of the present disclosure provide an electronic device having a heat-dissipation layer. By providing a heat-dissipating layer under the electronic panel, the temperature difference in various parts of the electronic panel can be reduced, thereby reducing the uneven brightness of the light-emitting elements. In addition, a first adhesive may be disposed in the first hole of the heat-dissipation layer to affix the position of the heat-dissipation layer, reduce the probability of the heat-dissipation layer being offset, and improve the mechanical strength of the electronic device. Furthermore, a second adhesive may be disposed in the second hole of the heat-dissipation layer to improve the heat-dissipation effect.

While the embodiments and the advantages of the present disclosure have been described above, it should be understood that, those skilled in the art may make various changes, substitutions, and alterations to the present disclosure without departing from the spirit and scope of the present disclosure. It should be noted that, different embodiments in the present disclosure may be arbitrarily combined as other embodiments as long as the combination conforms to the spirit of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. An electronic device, comprising:
   a support structure, comprising an adhesive region and a non-adhesive region;
   a heat-dissipation layer disposed on the support structure and comprising at least one first hole and at least one second hole,
   wherein the support structure comprises a support plate and a spacer, the spacer is disposed between the support plate and the heat-dissipation layer, the adhesive region is a region where the spacer is projected onto the support plate, the non-adhesive region is a remaining region of the support structure that the adhesive region is excluded,
   wherein a position of the at least one first hole corresponds to the adhesive region, and a position of the at least one second hole corresponds to the non-adhesive region;
   a first adhesive disposed in the at least one first hole; and
   an electronic panel disposed on the heat-dissipation layer.

2. The electronic device as claimed in claim 1, wherein the heat-dissipation layer further comprises a plurality of first holes and a plurality of second holes, and a minimum distance between adjacent two of the plurality of first holes is smaller than a minimum distance between adjacent two of the plurality of second holes.

3. The electronic device as claimed in claim 1, further comprising a second adhesive disposed in the at least one second hole.

4. The electronic device as claimed in claim 3, wherein a material of the first adhesive is different from a material of the second adhesive.

5. The electronic device as claimed in claim 1, wherein an area of one of the at least one first hole is smaller than an area of one of the at least one second hole.

6. The electronic device as claimed in claim 1, wherein a thermal conductivity of the heat-dissipation layer is in a range from 400 W/mK to 1500 W/mK.

7. The electronic device as claimed in claim 6, wherein a diameter of one of the at least one first hole is in a range from 3 mm to 8 mm.

8. The electronic device as claimed in claim 6, wherein an area of one of the at least one first hole is in a range from 7 mm2 to 64 mm2.

9. The electronic device as claimed in claim 6, wherein a ratio of a total area of the least one first hole to an area of the adhesive region is in a range from 20% to 30%.

10. The electronic device as claimed in claim 1, wherein a thermal conductivity of the heat-dissipation layer is in a range from 30 W/mK to 399 W/mK.

11. The electronic device as claimed in claim 10, wherein a diameter of one of the at least one first hole is in a range from 0.5 mm to 3 mm.

12. The electronic device as claimed in claim 10, wherein an area of one of the at least one first hole is in a range from 0.25 mm2 to 9 mm2.

13. The electronic device as claimed in claim 10, wherein a ratio of a total area of the least one first hole to an area of the adhesive region is in a range from 30% to 40%.

14. The electronic device as claimed in claim 1, further comprising a plurality of electronic panels disposed on the support structure, wherein two of the plurality of electronic panels share the heat-dissipation layer or the support structure.

15. The electronic device as claimed in claim 1, wherein the first adhesive is substantially flush with an upper surface of the heat-dissipation layer or a lower surface of the heat-dissipation layer.

16. The electronic device as claimed in claim 1, wherein the first adhesive is located between the electronic panel and the heat-dissipation layer.

17. The electronic device as claimed in claim 1, wherein the first adhesive is located between the support structure and the heat-dissipation layer.

18. The electronic device as claimed in claim 1, wherein the support structure comprises a groove, a portion of the spacer is disposed in the groove, and a portion of the spacer protrudes out of the groove.

* * * * *